United States Patent [19]

Kanauchi

[11] Patent Number: 4,837,466
[45] Date of Patent: Jun. 6, 1989

[54] DELAY CIRCUIT

[75] Inventor: Shushi Kanauchi, Tokyo, Japan

[73] Assignee: NEC Corporation, Tokyo, Japan

[21] Appl. No.: 122,806

[22] Filed: Nov. 19, 1987

[30] Foreign Application Priority Data

Nov. 19, 1986 [JP] Japan .................................. 61-277131

[51] Int. Cl.⁴ ............................................. H03K 5/153
[52] U.S. Cl. .................................... 307/605; 307/234; 307/362; 307/601
[58] Field of Search ............... 307/517, 518, 234, 362, 307/594, 597, 601, 603, 607

[56] References Cited

U.S. PATENT DOCUMENTS

| 3,365,586 | 1/1968 | Billings ................................. 307/362 |
| 4,670,668 | 6/1987 | Liu ....................................... 307/594 |
| 4,716,322 | 12/1987 | D'Arrigo et al. .................... 307/594 |

*Primary Examiner*—John Zazworsky
*Attorney, Agent, or Firm*—Sughrue, Mion, Zinn, Macpeak & Seas

[57] ABSTRACT

For reduction in occupying area and current consumed, there is disclosed a delay circuit for counting a time period comprising (a) a charging circuit operative to boost-up a voltage level at an output node thereof, (b) a resetting circuit operative to pull down the voltage level at the output node of the charging circuit prior to counting the time period, and (c) a comparator circuit operative to compare the voltage level at the output node of the charging circuit with a reference voltage level during counting said time period, and the comparator circuit is further operative to produce a delayed signal when the voltage level at the output node of the charging circuit exceeds the reference voltage level, so that the delay circuit does not need a large capacitor in comparison with a prior-art delay circuit of the RC combination type and reduces the number of component transistors comparing a prior-art delay circuit formed by a counter circuit serving as a frequency divider circuit.

9 Claims, 3 Drawing Sheets

DELAY CIRCUIT

FIELD OF THE INVENTION

This invention relates to a delay circuit and, more particularly, to a delay circuit suitable for an integrated circuit fabricated on a semiconductor substrate.

BACKGROUND OF THE INVENTION

A typical example of the delay circuit is formed by combination of a capacitor and a resistor with a time constant of CR, however the above circuit arrangement of the delay circuit is not suitable for an integrated circuit fabricated on a semiconductor substrate. This is because of the fact that the combination with a large time constant CR consumes a large amount of real estate on the semiconductor substrate and, for this reason, the integrated circuit is decreased in integration density.

Another known delay circuit is formed by a binary counter circuit supplied with a clock signal and the binary counter circuit serves as a frequency divider circuit. However, the binary counter circuit is usually constructed by a plurality of flip-flop circuits coupled in cascade so that a large number of component transistors are needed to form the binary counter circuit. This results in that a large amount of real estate is consumed to form the delay circuit. Moreover, the flip-flop circuits with a large number of transistors consume a large amount of current, then the delay circuit formed by the binary counter circuit is also undesirable for an integrated circuit fabricated on a semiconductor substrate.

SUMMARY OF THE INVENTION

It is therefor an important object of the present invention to provide a delay circuit suitable for an integrated circuit fabricated on a semiconductor substrate.

It is also an important object of the present invention to provide a delay circuit occupying a relatively small amount of area of a real estate of a semiconductor substrate.

It is also an important object of the present invention to provide a delay circuit consuming a relatively small amount of current.

In accordance with the present invention, there is provided a delay circuit for counting a time period comprising: (a) a charging circuit operative to boost-up a voltage level at an output node thereof; (b) a resetting circuit operative to start the charging circuit boosting up said voltage level at the output node in response to an input signal supplied from the outside of the delay circuit; and (c) a comparator circuit for detecting that the voltage level at the output node of the charging circuit exceeds a reference voltage level, thereby producing a delayed signal which is delivered after the time period measuring from the start of the boosting-up.

The charging circuit may comprise plural stages of charge pump circuits providing a conduction path coupled between a first source of voltage and the output node thereof and driven by two clock signals different in phase from each other by 180 degrees, a load capacitor coupled to the output node and operative to accumulate electric charges transferred from the first source of voltage by the charge pump circuits.

Moreover, the charging circuit may comprise a clock node thereof, a load capacitor coupled to the output node thereof, a charge pump circuit coupled between the output node thereof and the clock node, an activation transistor providing a conduction path coupled to a source of electric charges in an activated state, a first gate transistor providing a conduction path between the activation transistor and the charge pump circuit during counting the time period and blocking the conduction path prior to counting the time period, and a second gate transistor intervening between the clock node and the charge pump circuit and operative to provide a conduction path therebetween during counting the time period and to block the conduction path prior to counting the time period.

Similarly, the resetting circuit may comprise a field effect transistor providing a conduction path between the output node of the charging circuit and the second source of voltage prior to counting the time period and blocking the conduction path during counting the time period. Alternatively, the resetting circuit may comprise a first inverter circuit operative to produce the inverse of an input signal, and a second inverter circuit having first and second field effect transistors with respective gate electrodes applied with the input signal and the inverse thereof, respectively, to electrically couple the output node of the charging circuit to the first source of voltage or to the second source of voltage.

On the other hand, the comparator circuit may comprise a current mirror circuit operative to produce an output signal at an output node thereof, a first inverter circuit operative to produce the inverse of the output signal at the output node of the current mirror circuit, and a second inverter circuit having two field effect transistors coupled in series between the first source of voltage and the second source of voltage and provided with respective gate electrodes coupled to the output node of the charging circuit and an output node of the first inverter circuit, and the current mirror circuit is operative to change the voltage level of the output signal thereof when the voltage level at the output node of the charging circuit excesses a reference voltage level.

The delay circuit may be accompanied by a clock signal generating circuit comprising a phase shift oscillator circuit, and a series combination of a first CMOS type inverter circuit, a first output node and a second CMOS type inverter circuit coupled between the phase shift oscillator and a second output node, then the two clock signals appear at the first output node and the second output node, respectively. Moreover, the phase shift oscillator circuit may comprise plural stages of CMOS type inverter circuits arranged in series, a plurality of integrating circuits each intervening between the two adjacent CMOS type inverter circuits or between the final stage of the CMOS type inverter circuit and an output node of the phase shift oscillator circuit, and an activation transistor operative to provide a conduction path between the output node of the phase shift oscillator circuit and the second source of voltage and to block the conduction path in an activated state thereof.

BRIEF DESCRIPTION OF THE DRAWINGS

The features and advantages of a delay circuit according to the present invention will be more clearly understood from the following description taken in conjunction with the accompanying drawings in which.

DESCRIPTION OF THE PREFERRED EMBODIMENTS

First Embodiment

Figure 1:
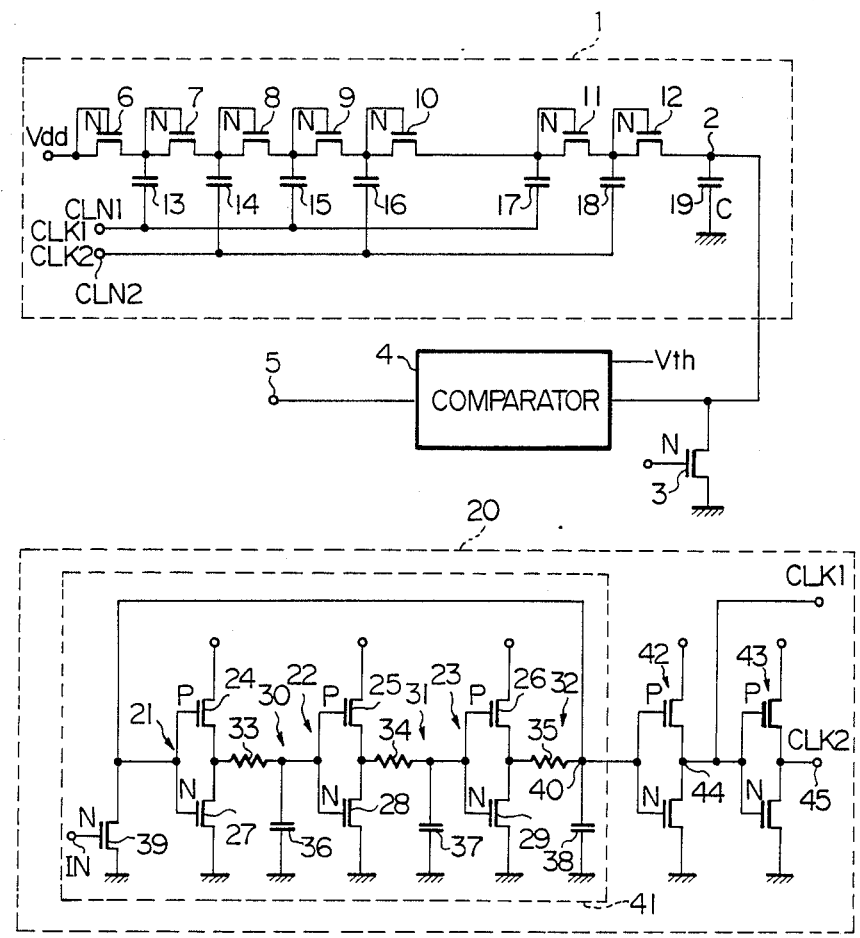
FIG. 1 is a diagram showing the circuit arrangement of a delay circuit embodying the present invention.

Referring now to FIG. 1 of the drawings, the circuit arrangement of a delay circuit according to the present invention is illustrated and comprises a charging circuit 1 with two clock nodes CLN1 and CLN2 and an output node 2, a resetting circuit formed by an n-channel type MOS field effect transistor 3, and a comparator circuit 4 with an output node 5 where a delayed signal appears. In detail, the charging circuit 1 is of the charge pump type driven by a phase one clock signal CLK1 and a phase two clock signal CLK2 different in phase from the phase one clock signal CLK1 by 180 degrees and comprises seven n-channel type MOS field effect transistors 6, 7, 8, 9, 10, 11 and 12 capable of providing respective source-drain paths coupled in series between a source of positive voltage Vdd and the output node 2 and six capacitors 13, 14, 15, 16, 17 and 18 each selectively coupled between one of the clock nodes CLN1 and CLN2 and an intermediate node of the two n-channel type MOS field effect transistors. Namely, each of the capacitors 13, 15 and 17 has one electrode coupled to the clock node CLN1 and the other electrode coupled to the intermediate node between the n-channel type MOS field effect transistors 6 and 7, 8 and 9 or 10 and 11, and each of the capacitors 14, 16 and 18 has one electrode coupled to the clock node CLN2 and the other electrode coupled to the intermediate node between the n-channel type MOS field effect transistors 7 and 8, 9 and 10 or 11 and 12. A load capacitor 19 has a capacitance C coupled between the output node 2 and the ground terminal. Each of the n-channel type MOS field effect transistors 6 to 12 has a gate electrode coupled to a drain node thereof so that each n-channel type MOS field effect transistor serves as a rectifier element. The source of positive voltage Vdd supplies the leftmost transistor 6 with the positive high voltage level Vdd, then the six stages of charge pump circuits are driven by the phase one clock CLK1 and the phase two clock CLK2 and relay electric charges from the source of positive voltage Vdd to the load capacitor 19. The n-channel type MOS field effect transistor 3 has a gate electrode to which a resetting signal of a positive high voltage level is applied and the n-channel type MOS field effect transistor 3 discharges the electric charges accumulated in the load capacitor 19 to the ground terminal, thereby resetting the charging circuit 1. The comparator circuit 4 is operative to compare the voltage level at the output node 2 with a predetermined threshold voltage Vth and to invert an output signal thereof between the positive high voltage level and the ground voltage level when the voltage level at the output node 2 exceeds the threshold voltage Vth.

The delay circuit illustrated in FIG. 1 is accompanied by a clock signal generating circuit 20 which produces the phase one clock signal CLK1 and the phase two clock signal CLK2. The clock signal generating circuit 20 comprises first, second and third CMOS type inverter circuits 21, 22 and 23 each consisting of a p-channel type MOS field effect transistor 24, 25 or 26 and an n-channel type MOS field effect transistor 27, 28 or 29. Each of the CMOS type inverter circuit 21, 22 and 23 is accompanied by an integrating circuit 30, 31 or 32 consisting of a resistor 33, 34 or 35 and a capacitor 36, 37 or 38. The resistance R of each resistor 33, 34 or 35 and the capacitance of each capacitor 36, 37 or 38 are selected in such a manner that each CMOS type inverter circuit 21, 22 or 23 is supplied the next CMOS type inverter circuit with an output signal delayed by 60 degrees from the output signal of the previous stage. The clock signal generating circuit 20 further comprises an n-channel type MOS field effect transistor 39 coupled between an output node 40 of the integrating circuit 32 and the ground terminal and having a gate electrode to which an input signal IN of the positive high voltage level is supplied, then the clock signal generating circuit 20 is activated in the presence of the input signal IN but remains in non-active state in the absence of the input signal IN. The CMOS type inverter circuits 21 to 23, the integrating circuits 30 to 32 and the n-channel type MOS field effect transistor 39 as a whole constitutes a phase shift oscillator 41. The output node 40 of the integrating circuit 32 is coupled to a CMOS type inverter circuit 42 which in term is coupled to a CMOS type inverter circuit 43. The CMOS type inverter circuit has a common drain node 44 and the CMOS type inverter circuit also has a common drain node 45. The common drain nodes 44 and 45 is coupled to the clock nodes CLN1 and CLN2, respectively, so that the charging circuit 1 is supplied with the phase one clock signal CLK1 and the phase two clock signal CLK2 from the clock signal generating circuit 20 in the presence of the input signal IN.

Figure 2:
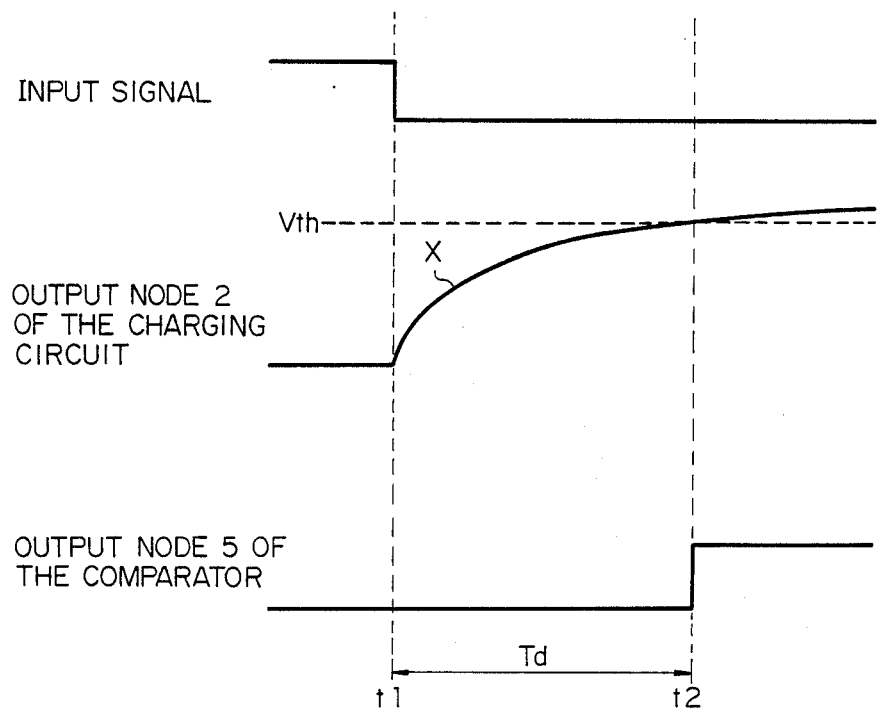
FIG. 2 is a graph showing the waveforms of important signals appearing in the delay circuit illustrated in FIG. 1.

Description is hereinunder made for operation with reference to FIG. 2 of the drawings. When both of the resetting signal and the input signal IN go up to the positive high voltage level, the n-channel type MOS field effect transistor 3 turns on to discharge the electric charges accumulated in the load capacitor 19 and, on the other hand, the clock signal generating circuit 20 is shifted into the non-active state. At time t1, the resetting signal goes down to the ground voltage level and, accordingly, the input signal IN also goes down to the ground voltage level. This results in that the output node 2 is blocked from the ground terminal and that the clock signal generating circuit 20 begins to produce the phase one clock signal CLK1 and the phase two clock signal CLK2. With the complementary clock signals CLK1 and CLK 2, the electric charges are transferred from the source of positive voltage Vdd through the capacitors 13 to 18 to the load capacitor 19, then the voltage level at the output node 2 arises as indicated by plots X in FIG. 2. When the voltage level at the output node 2 exceeds the threshold voltage Vth of the comparator circuit at time t2, the comparator circuit 4 inverts the output signal thereof from the ground voltage level to the positive high voltage level. As a result, the output signal of the comparator circuit 4 goes up to the positive high voltage level after a time period Td measuring from time t1 to time t2. The time period Td is varied by changing the capacitances of the capacitors 13, 14, 15, 16, 17 and 18 or, alternatively, by changing the capacitance of the load capacitor 19. Consequently, the delay circuit according to the present invention is capable of retarding the input signal IN by the time period Td calculated by the capacitances of the capacitors 13 to 19.

Second Embodiment

Figure 3:
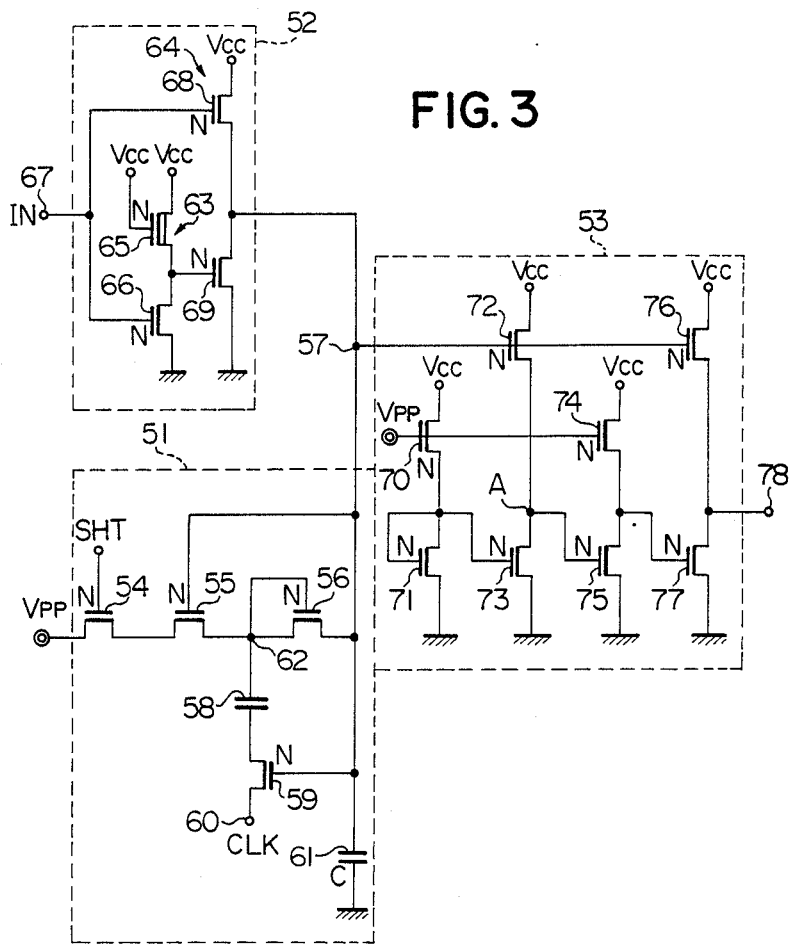
FIG. 3 is a diagram showing the circuit arrangement of another delay circuit embodying the present invention.

Turning to FIG. 3 of the drawings, there is shown the circuit arrangement of another delay circuit according to the present invention. The delay circuit illustrated in FIG. 3 comprises a charging circuit 51, a resetting circuit 52 and a comparator circuit 53. The charging circuit 51 comprises three n-channel type MOS field effect transistors 54, 55 and 56 coupled in series between a source of reference voltage Vpp and an output node 57 of the charging circuit 51, a series combination of a capacitor 58 and an n-channel type MOS field effect transistor 59 coupled between a clock node 60 and an intermediate node 62 between the n-channel type MOS field effect transistors 55 and 56, and a load capacitor with a capacitance C. The n-channel type MOS field effect transistor 56 has a gate electrode coupled to the intermediate node 62 so that the n-channel type MOS field effect transistor 56 and the capacitor 58 as a whole constitutes a single stage charge pump circuit similar to one of the charge pump circuits in FIG. 1. The n-channel type MOS field effect transistor 54 has a gate electrode to which a shifting signal SHT of a positive high voltage level is supplied, then the source of reference voltage Vpp is capable of supplying the intermediate node 62 with electric charges. The shifting signal SHT swings its voltage level between two voltage levels different by a voltage value of Vpp. The n-channel type MOS field effect transistors 55 and 59 have respective gate electrodes commonly coupled to the output node 57 so that the two n-channel type MOS field effect transistors 55 and 59 serve as transfer gates operative to establish or block respective conduction paths between the source of reference voltage Vpp and the intermediate node 62 and between the clock node 60 and the capacitor 58 depending upon the voltage level at the output node 57.

The resetting circuit 52 comprises first and second inverter circuits 63 and 64 each coupled between a source of positive voltage Vcc and a ground terminal. The first inverter circuit 63 comprises two n-channel type MOS field effect transistors 65 and 66 the former of which is of the depletion type and the latter of which is of the enhancement type. The n-channel type MOS field effect transistor 65 has a gate electrode coupled to the source of positive voltage Vcc so that the n-channel type MOS field effect transistor 65 serves as a load transistor. The n-channel type MOS field effect transistor 66 has a gate electrode coupled to an input node where an input signal IN of the positive high voltage level appears, so that the first inverter circuit can produce a resetting signal of the positive high voltage level in the absence of the input signal IN of the positive high voltage level. On the other hand, the second inverter circuit 64 comprises two n-channel type MOS field effect transistors 68 and 69 coupled in series between the source of positive voltage Vcc and the ground terminal and having respective gate electrodes. The gate electrode of the n-channel type MOS field effect transistor 68 is coupled to the input node 67 and the gate electrode of the n-channel type MOS field effect transistor 69 is coupled to a common drain node of the n-channel type MOS field effect transistors 65 and 66, so that the second inverter circuit 64 provides a conduction path from the load capacitor 61 to the ground terminal in the presence of the resetting signal. The resetting circuit 52 thus arranged is operative to reset the charging circuit 51 by discharging the electric charges accumulated in the load capacitor 61 in the absence of the input signal IN of the positive high voltage level. Moreover, the output node 57 is coupled to the source of positive high voltage Vcc through the n-channel type MOS field effect transistor 68 when the input node 67 remains in the positive high voltage level, so that the resetting circuit 52 is further operative to charge up the load transistor 61.

The comparator circuit 53 comprises four series combinations of n-channel type MOS field effect transistors 70 and 71, 72 and 73, 74 and 75 and 76 and 77 each coupled between the source of positive voltage Vcc and the ground terminal. The n-channel type MOS field effect transistors 71 and 73 have respective gate electrodes commonly coupled to a drain node of the n-channel type MOS field effect transistor 71 to form in combination a current mirror configuration. The n-channel type MOS field effect transistors 72 and 76 have respective gate electrodes coupled to the output node 57 and, on the other hand, the n-channel type MOS field effect transistors 70 and 74 have respective gate electrodes coupled to the source of reference voltage Vpp. The n-channel type MOS field effect transistor 75 has a gate electrode coupled to a drain node A of the n-channel type MOS field effect transistor 73 and gate electrode of the n-channel type MOS field effect transistor 77 is coupled to a drain node of the n-channel type MOS field effect transistor 75. The n-channel type MOS field effect transistor 74 thus coupled serves as a load transistor and, then, the series combination of the n-channel MOS transistors 74 and 75 form in combination an inverter circuit with the load transistor. An output node 78 of the comparator circuit 53 is provided between the n-channel type MOS field effect transistors 76 and 77. In this instance, all of the component MOS field effect transistors 70 to 77 are similar in characteristics to one another so that each of the transistors has a preselected threshold voltage.

In operation, when the input signal IN of the positive high voltage level does not appear at the input node 67, the first inverter circuit 63 produces the resetting signal of the positive high voltage level which in turn causes the second inverter circuit 64 to turn on to provide the conduction path from the load capacitor 69 to the ground terminal. Then, the electric charges accumulated in the load capacitor 61 are discharged to the ground terminal through the n-channel type MOS field effect transistor 69 in on-state, thereby resetting the charging circuit 51. The shifting signal SHT goes up to the positive high voltage level so that the n-channel type MOS field effect transistor 54 turns on to propagate the reference voltage level Vpp. Then, the charging circuit 51 is shifted into a ready-for-start condition.

Subsequently, the input signal IN, goes up to the positive high voltage level a first time, then the output signal of the first inverter circuit 63 is switched to the ground voltage level which causes the second inverter circuit 64 to produce the output signal of the positive high voltage level. This results in that the load capacitor 61 is charged up to the positive high voltage level lower than the voltage level fed from the source of positive voltage Vcc by a threshold voltage Vth of the n-channel type MOS field effect transistor 68. When the output node 57 of the charging circuit 51 excesses threshold voltages of the n-channel type MOS field effect transistors 55 and 59, the n-channel type MOS field effect transistors 55 and 59 turn on to provide the conduction paths between the source of reference voltage Vpp and the intermediate node 62 and between the clock node 60 and the capacitor 58. Then, the charge pump circuit consisting of the capacitor 58 and the n-channel type MOS field effect transistor 56 is driven by a clock signal CLK appearing at the clock node 60 and transfers the electric charges to the capacitor 58. Finally, the output node 57 arises beyond the voltage level Vpp.

The amount of drain current I1 of the MOS field effect transistor 70 influences the amount of drain current I2 of the MOS field effect transistor 72 by the agency of the current mirror configuration formed by the MOS field effect transistors 71 and 73. Namely, When the voltage level at the output node 57 is lower than the reference voltage level Vpp, the amount of current I1 is smaller than the amount of current I2, so that the voltage level Va at the drain node A is calculated by $$Va = I2 \times R73 \quad \text{(Eq. 1)}$$

where R73 is the on-resistance of the MOS field effect transistor 73. On the other hand, when the voltage level at the output node 57 is higher than the reference voltage level Vpp, the voltage level at the drain node A is calculated by $$Va = Vcc - I2 \times R72 \quad \text{(Eq. 2)}$$

where R72 is the on-resistance of the MOS field effect transistor 72 which is equal in value to that of the MOS field effect transistor 73. In other words, the current mirror configuration alters the voltage level Va at the drain node A of the MOS field effect transistor 73 on the basis of the result of comparing the voltage level at the output node 57 with the reference voltage level Vpp. With the voltage level Va at the drain node A of the MOS field effect transistor 73, the inverter circuit consisting of the MOS field effect transistors 74 and 75 produces an output signal changing its voltage level in the inverse direction of the output node 57. The output signal of the inverter circuit and the voltage level at the output node 57 are supplied to the gate electrodes of the MOS field effect transistors 76 and 77, respectively, so that the output node 78 rapidly changes the voltage level when the voltage level at the output node 57 excesses the reference voltage level Vpp (time t12). The delay circuit illustrated in FIG. 3 thus produces a time delay measuring from the first time to the second time.

As will be understood from the foregoing description, the delay circuit according to the present invention is operative to produce a time delay which is varied by changing the capacitances of the capacitors forming part of the charging circuit, and is advantageous over the prior-art delay circuits in the amount of current consumed and in that the amount of area occupied.

The delay circuit according to the present invention can find a wide variety of applications one of which may be a boost-up circuit for a word line in an EPROM device. In this application, a write-in timing is precisely determined by using the delay circuit according to the present invention.

Although particular embodiment of the present invention have been shown and described, it will be obvious to those skilled in the art that various changes and modifications may be made without departing from the spirit and scope of the present invention.

What is claimed is:

1. A delay circuit for counting a time period comprising:
   (a) a charging circuit operative to boost-up a voltage level at an output node thereof;
   (b) a resetting circuit operative to start said charging circuit boosting up said voltage level at said output node in response to an input signal supplied form the outside of said delay circuit; and
   (c) a comparator circuit for detecting that the voltage level at the output node of said charging circuit exceeds a reference voltage level, thereby producing a delayed signal which is delivered after said time period measuring from the start of said boosting-up, in which said charging circuit comprises plural stages of charge pump circuits providing a conduction path coupled between a first source of voltage and the output node thereof and driven by two clock signals different in phase from each other by 180 degrees, a load capacitor coupled to the output node and operative to accumulate electric charges transferred from the first source of voltage by said charge pump circuits and in which said delay circuit is accompanied by a clock signal generating circuit comprising a phase shift oscillator circuit, and a series combination of a first CMOS type inverter circuit, a first output node and a second CMOS type inverter circuit coupled between said phase shift oscillator and a second output node, said two clock signals appearing at said first output node and said second output node, respectively.

2. A delay circuit as set forth in claim 1 in which said phase shift oscillator circuit comprises plural stages of CMOS type inverter circuits arranged in series, a plurality of integrating circuits each intervening between the two adjacent CMOS type inverter circuits or between the final stage of said CMOS type inverter circuit and an output node of said phase shift oscillator circuit and an activation transistor operative to provide a conduction path between the output node of said phase shift oscillator circuit and a second source of voltage different in voltage level from said first source of voltage in a non-activated state thereof and to block said conduction path in an activated state thereof.

3. A delay circuit for counting a time period comprising:
   (a) a charging circuit operative to boost-up a voltage level at an output node thereof and comprising plural stage of charge pump circuits providing a conduction path coupled between a first source of voltage and the output node thereof and driven by two clock signals different in phase from each other by 180 degrees, a load capacitor coupled between the output node and a second source of voltage different in voltage hold from the first source of voltage and operative to accumulate electric charges transferred from the first source voltage by said charge pump circuits, each of said charge pump circuits being provided with a rectifier component element forming a part of said conduction path and a capacitor coupled at one end thereof to the rectifier component element and at the other end thereof to one of clock nodes where one of said two clock signals are supplied, said rectifier component element being formed by a field effect transistor having a agate electrode coupled to a drain electrode thereof;

(b) a resetting circuit operative to start said charging circuit boosting up said voltage level at said output node of said charging circuit in response to an input signal supplied from the outside of said delay circuit and comprising a field effect transistor providing a conduction path between the output node of said charging circuit and said second source of voltage prior to counting said time period and blocking said conduction path during counting said time period;

(c) a comparator circuit operative to compare the voltage level at the output node of said charging circuit with a reference voltage level during counting said time period, said comparator circuit being operative produce a delayed signal when the voltage level at the output node of said charging circuit exceeds said reference voltage level.

4. A delay circuit for counting a time period fabricated on a semiconductor substrate, comprising:

(a) a charging circuit operative to boost-up a voltage level at an output node thereof, said charging circuit comprising a clock node thereof, a load capacitor coupled to said output node thereof, a charge pump circuit coupled between said output node thereof and said clock node, an activation transistor providing a conduction path from a source of electric charges in an activated state, a first gate transistor providing a conduction path between said activation transistor and said charge pump circuit during counting said time period and blocking said conduction path prior to counting said time period, and a second gate transistor intervening between said clock node and said charge pump circuit and operative to provide a conduction path therebetween during counting said time period and to block said conduction path prior to counting said time period, said charge pump circuit comprising a rectifier component element coupled between said first gate transistor and the output node of said charging circuit and a capacitor coupled between said rectifier component element and said clock node, said rectifier component element being formed by a field effect transistor having a gate electrode coupled to a drain node thereof;

(b) a resetting circuit operative to pull down the voltage level at the output node of said charging circuit prior to counting said time period, said resetting circuit comprising a first inverter circuit operative to produce the inverse of an input signal, and a second inverter circuit having first and second field effect transistors with respective gate electrodes applied with said input signal and the inverse thereof, respectively, to electrically couple the output node of said charging circuit to a first source of voltage or to a second source of voltage different in voltage level from said first source of voltage; and (c) a comparator circuit operative to compare the voltage level at the output node of said charging circuit with a reference voltage level during counting said time period, said comparator circuit being operative to produce a delayed signal when the voltage level at the output node of said charging circuit exceeds said reference voltage level, said comparator circuit comprising a current mirror circuit operative to produce an output signal at an output node thereof, a first inverter circuit operative to produce the inverse of the output signal at the output node of said current mirror circuit, and a second inverter circuit having two field effect transistors coupled in series between said first source of voltage and said second source of voltage and provided with respective gate electrodes coupled to the output node of said charging circuit and an output node of said first inverter circuit, said current mirror circuit being operative to change the voltage level of said output signal thereof when the voltage level at the output node of said charging circuit exceeds a reference voltage level.

5. A delay circuit for counting a time period comprising:

(a) a charging circuit operative to boost-up a voltage level at an output node thereof;

(b) a resetting circuit operative to start said charging circuit boosting up said voltage level at said output node in response to an input signal supplied form the outside of said delay circuit; and (c) a comparator circuit for detecting that the voltage level at the output node of said charging circuit exceeds a reference voltage level, thereby producing a delayed signal which is delivered after said time period measuring from the start of said boosting-up, in which said charging circuit comprises a clock node thereof where a clock signal appears, a load capacitor coupled to said output node thereof a charge pump circuit coupled between said output node thereof and said clock node, an activation transistor providing a conduction path from a source of electric charges in an activated state, a first gate transistor providing a conduction path between said activation transistor and said charge pump circuit during counting said time period and blocking said conduction path prior to counting said time period, and a second gate transistor intervening between said clock node and said charge pump circuit and operative to provide a conduction path therebetween during counting said time period and to block said conduction path prior to counting said time period.

6. A delay circuit as set forth in claim 5, in which said charge pump circuit comprises a rectifier component element coupled between said first gate transistor and the output node of the charging circuit and a capacitor coupled between said rectifier component element and said clock node.

7. A delay circuit as set forth in claim 6, in which said rectifier component element is formed by a field effect transistor having a gate electrode coupled to a drain node thereof.

8. A delay circuit for counting a time period comprising:

(a) a charging circuit operative to boost-up a voltage level at an output node thereof;

(b) a resetting circuit operative to start said charging circuit boosting up said voltage level at said output node in response to an input signal supplied from the outside of said delay circuit; and (c) a comparator circuit for detecting that the voltage level at the output node of said charging circuit exceeds a reference voltage level, thereby producing a delayed signal which is delivered after said time period measuring from the start of said boosting-up, in which said resetting circuit comprises a first inverter circuit operative to produce the inverse of an input signal, and a second inverter circuit having a first and second field effect transistor with respective gate electrodes applied with said input signal and the inverse thereof, respectively, to electrically couple the output node of said charging circuit to a first source of voltage or to a second source of voltage different in voltage level from said first source of voltage.

9. A delay circuit for counting a time period comprising:
(a) a charging circuit operative to boost-up voltage level at an output node thereof;
(b) a resetting circuit operative to start said charging circuit boosting up said voltage level at said output node in response to an input signal supplied from the outside of said delay circuit; and
(c) a comparator circuit for detecting that the voltage level at the output node of said charging circuit exceeds a reference voltage level, thereby producing a delayed signal which is delivered after said time period measuring from the start of said boosting-up, in which said comparator circuit comprises a current mirror circuit operative to produce an output signal at an output node thereof, a first inverter circuit operative to produce the inverse of the output signal at the output node of said current mirror circuit, and a second inverter circuit having two field effect transistors coupled in series between a first source of voltage and a second source of voltage and provided with respective gate electrodes coupled to the output node of said charging circuit and an output node of said first inverter circuit, respectively, said current mirror circuit being operative to change the voltage level of said output signal thereof when the voltage level at the output node of said charging circuit exceeds a reference voltage level.

* * * * *

UNITED STATES PATENT AND TRADEMARK OFFICE
CERTIFICATE OF CORRECTION

PATENT NO. : 4,837,466

DATED : June 6, 1989

INVENTOR(S) : SHUSHI KANAUCHI

It is certified that error appears in the above-identified patent and that said Letters Patent is hereby corrected as shown below:

Column 8, line 7, delete "form" and insert --from--.

Signed and Sealed this

Twenty-seventh Day of February, 1990

Attest:

JEFFREY M. SAMUELS

*Attesting Officer*  *Acting Commissioner of Patents and Trademarks*